(12) United States Patent
Andreev et al.

(10) Patent No.: US 6,941,494 B1
(45) Date of Patent: Sep. 6, 2005

(54) BUILT-IN TEST FOR MULTIPLE MEMORY CIRCUITS

(75) Inventors: Alexander E. Andreev, San Jose, CA (US); Igor A. Vikhliantsev, Santa Clara, CA (US); Lav D. Ivanovic, Cupertino, CA (US)

(73) Assignee: LSI Logic Corporation, Milpitas, CA (US)

( * ) Notice: Subject to any disclaimer, the term of this patent is extended or adjusted under 35 U.S.C. 154(b) by 588 days.

(21) Appl. No.: 10/027,311

(22) Filed: Dec. 21, 2001

(51) Int. Cl.[7] .......................................... G11C 29/00
(52) U.S. Cl. .................... 714/718; 714/736; 714/25
(58) Field of Search ................ 714/718, 719, 714/720, 724, 733, 736, 25; 365/201

(56) References Cited

U.S. PATENT DOCUMENTS

| | | | | |
|---|---|---|---|---|
| 6,044,481 A | * | 3/2000 | Kornachuk et al. | 714/724 |
| 6,088,823 A | * | 7/2000 | Ayres et al. | 714/733 |
| 6,263,461 B1 | * | 7/2001 | Ayres et al. | 714/718 |
| 6,510,530 B1 | * | 1/2003 | Wu et al. | 714/30 |
| 6,567,325 B1 | * | 5/2003 | Hergott | 365/201 |
| 6,587,979 B1 | * | 7/2003 | Kraus et al. | 714/720 |
| 6,694,461 B1 | * | 2/2004 | Treuer | 714/719 |

OTHER PUBLICATIONS

M. Lobetti-Bodoni et al., "An Effective Distributed BIST Architecture for RAMs", May 23-26, 2000, IEEE European Test Workshop, pp 119-124.*
U.S. Appl. No. 09/679,209, Andreev et al.
U.S. Appl. No. 09/679,313, Andreev et al.

* cited by examiner

*Primary Examiner*—Guy J. Lamarre
*Assistant Examiner*—John P. Trimmings
(74) *Attorney, Agent, or Firm*—Fitch, Even, Tabin & Flannery

(57) ABSTRACT

A memory test circuit includes a collar for coupling to a memory device for switching an address bus and a data bus of the memory device between an external circuit and the collar in response to a switching signal; and a controller coupled to the collar for generating the switching signal, a test vector, and control signals between the controller and the collar on as few as seven control lines for testing the memory device with the test vector. Multiple memory devices of various sizes may be tested with the same controller concurrently.

22 Claims, 9 Drawing Sheets

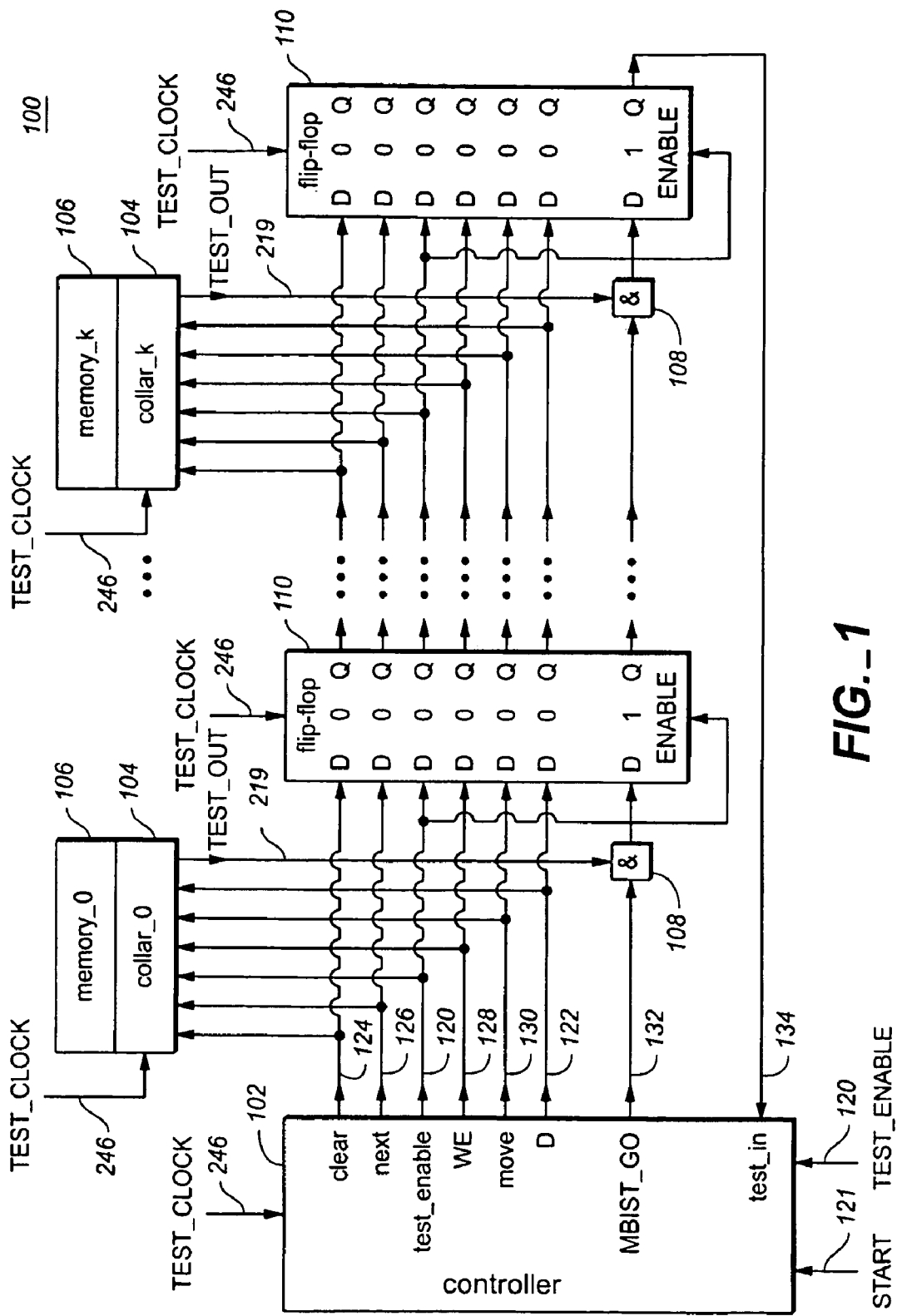
FIG._1

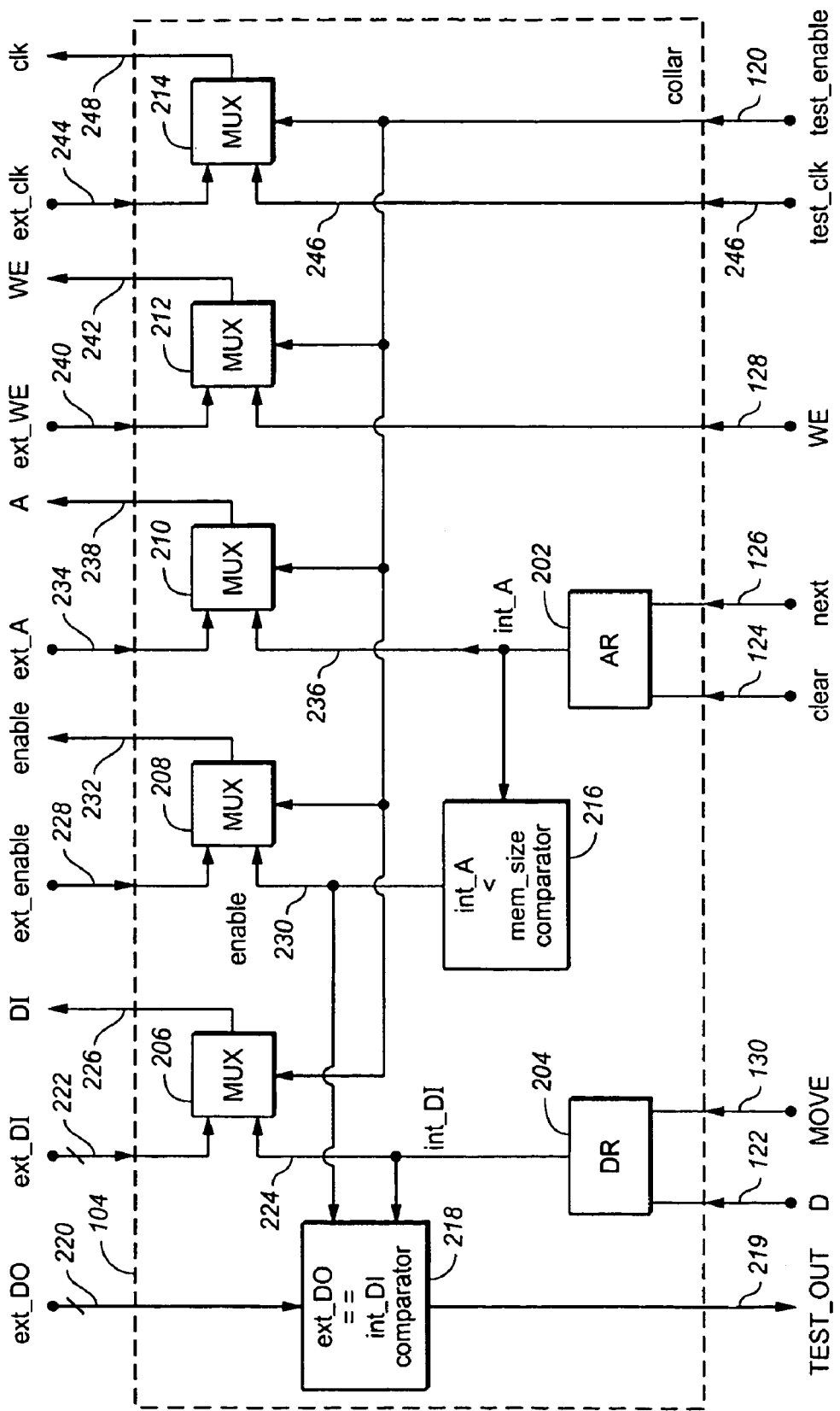
FIG._2

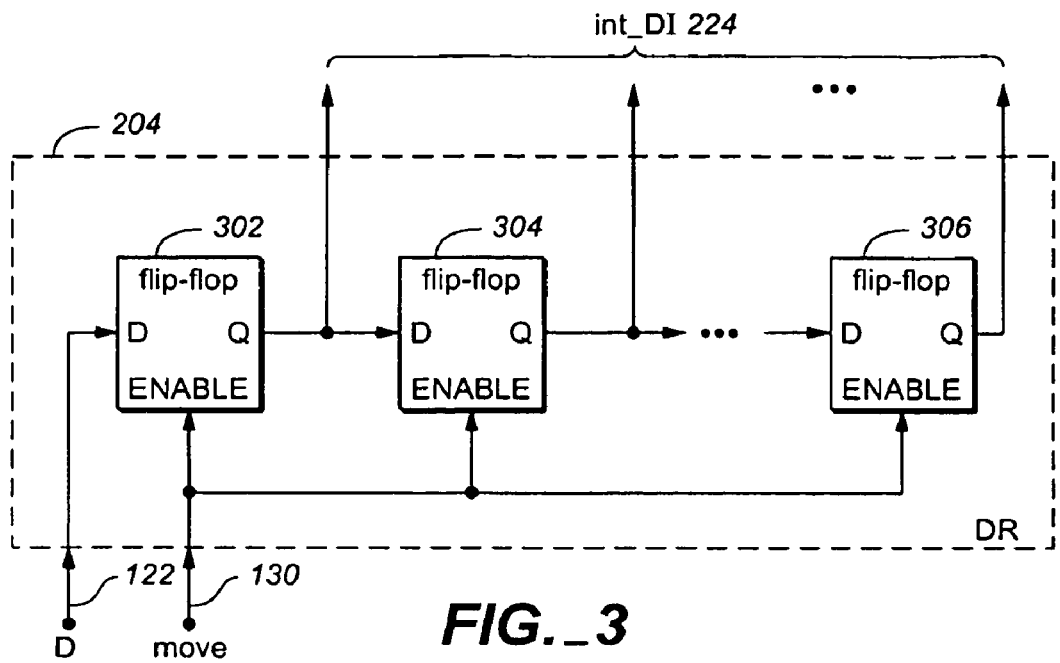
FIG._3
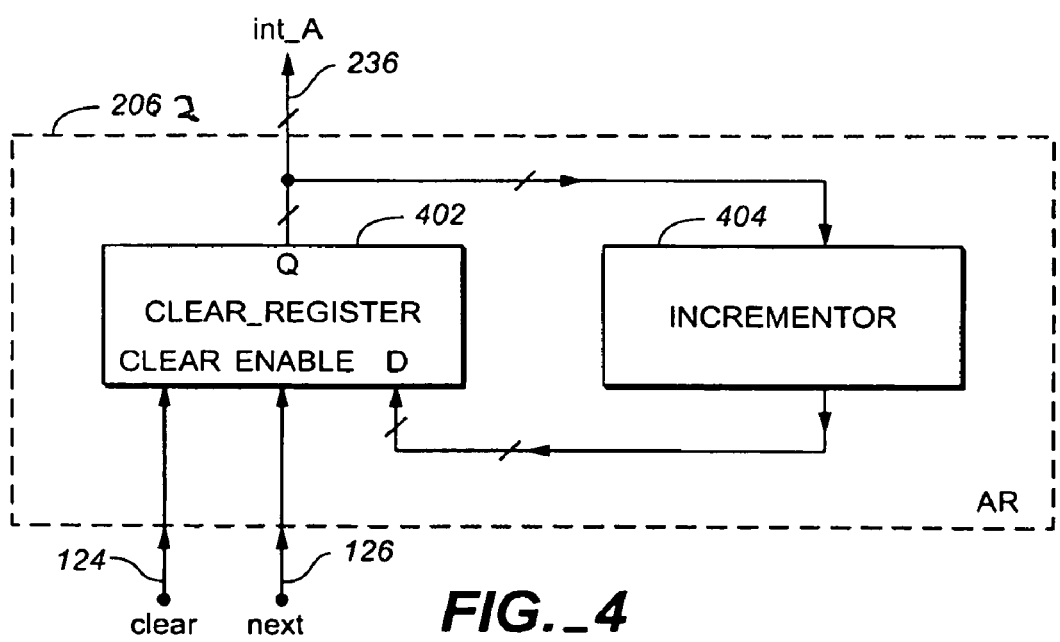
FIG._4

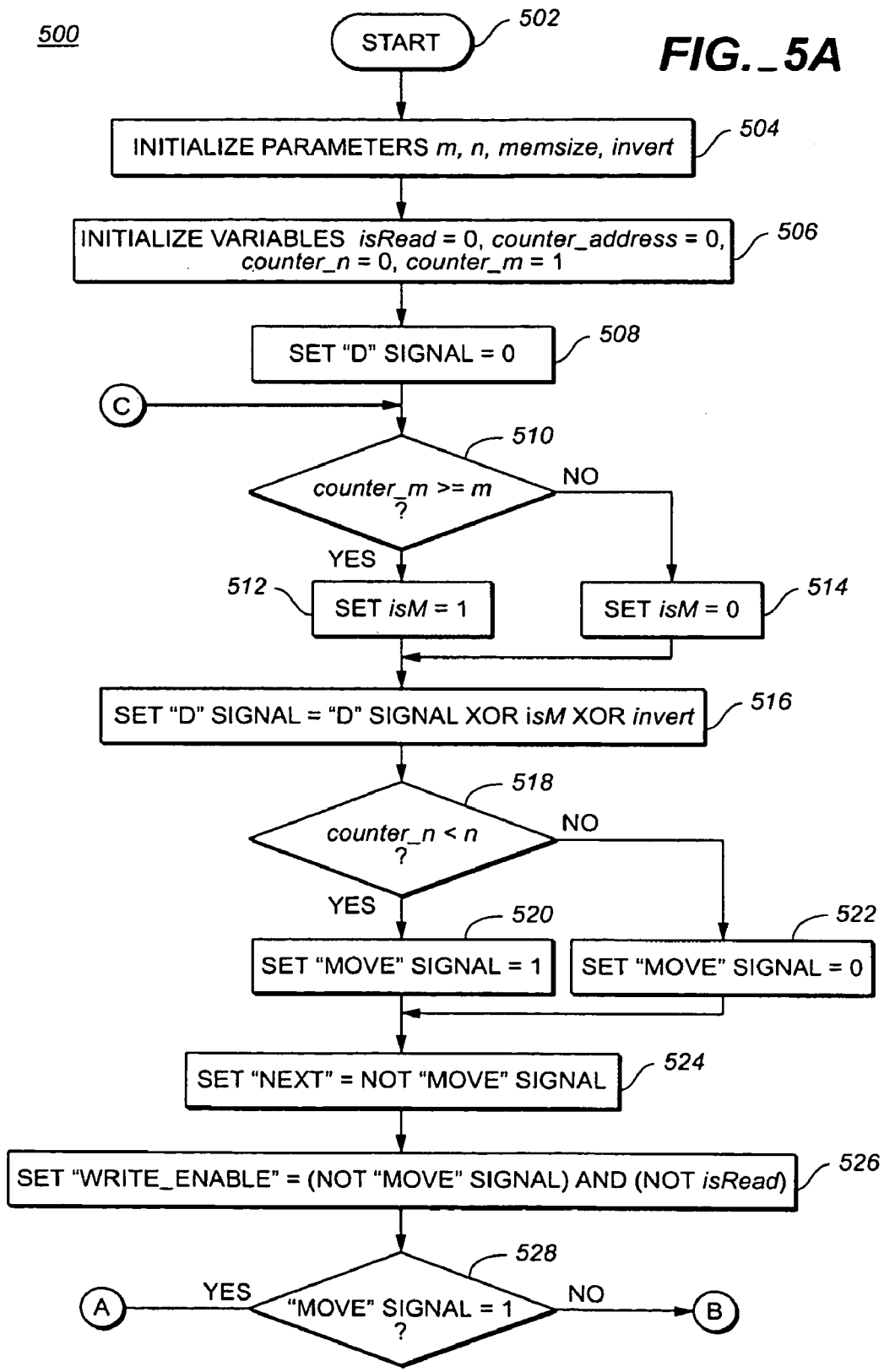
FIG._5A

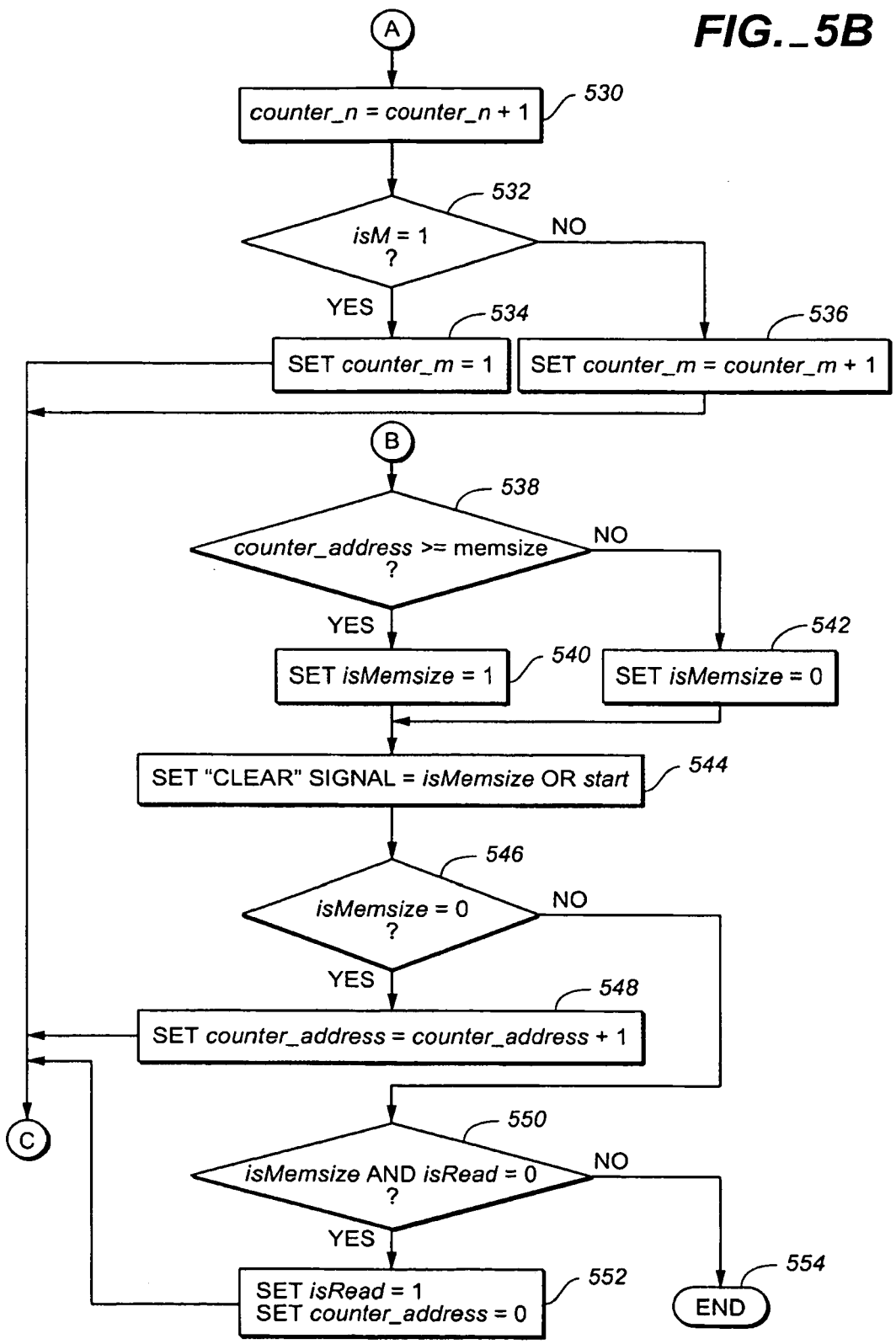
FIG._5B

FIG._6

| | fill DR(n steps) | memory write (memsize steps) | memory read (memsize steps) |
|---|---|---|---|
| clear | 1 0 0 ... 0 | 0 0 0 ... 0 | 0 1 0 ... 0 |
| move | 1 1 1 ... 1 | 1 0 0 ... 0 | 0 0 0 ... 0 |
| next | 0 0 0 ... 0 | 0 1 1 ... 1 | 1 1 1 ... 1 |
| WE | 0 0 0 ... 0 | 0 1 1 ... 1 | 1 0 0 ... 0 |
| D | 0...0 1 0...0 $\alpha$ | $\alpha \oplus$ is M ... $\alpha \oplus$ is M | $\alpha \oplus$ is M ... $\alpha \oplus$ is M |

(braces under D columns: m, m, m)

FIG._8

| | fill DR(n steps) | memory write memsize+[memsize/k] steps | fill DR(n steps) | memory read memsize+[memsize/k] steps |
|---|---|---|---|---|
| clear | 1 0 0 0 ... 0 | 0 ... 0 | 1 0 0 ... 0 | 0 ... 0 |
| move | 1 1 1 1 ... 1 | 1 0...0 1  1 0...0 1  $\overline{\alpha}$ | 1 ... 1 | 1 0...0 1  1 0...0 1  $\overline{\alpha}$ |
| next | 0 0 0 0 ... 0 | 0 1...1 0  1...1 0  $\overline{\alpha}$ | 0 ... 0 | 0 1...1 0  1...1 0  $\overline{\alpha}$ |
| WE | 0 0 0 0 ... 0 | 1 0...0 1  1 0...0 1  $\overline{\alpha}$ | 0 ... 0 | 0 | 0 |
| D | 0 1 0 1 ... $\overline{\alpha}$ $\alpha$ | $\overline{\alpha}$ ... $\overline{\alpha}$  $\overline{\alpha}$ ... $\overline{\alpha}$  $\alpha$ | 0 1 0 1 ... $\alpha$ | $\alpha$ ... $\alpha$  $\overline{\alpha}$ ... $\overline{\alpha}$  $\alpha$ |

(braces: n, k, k, n, k, k)

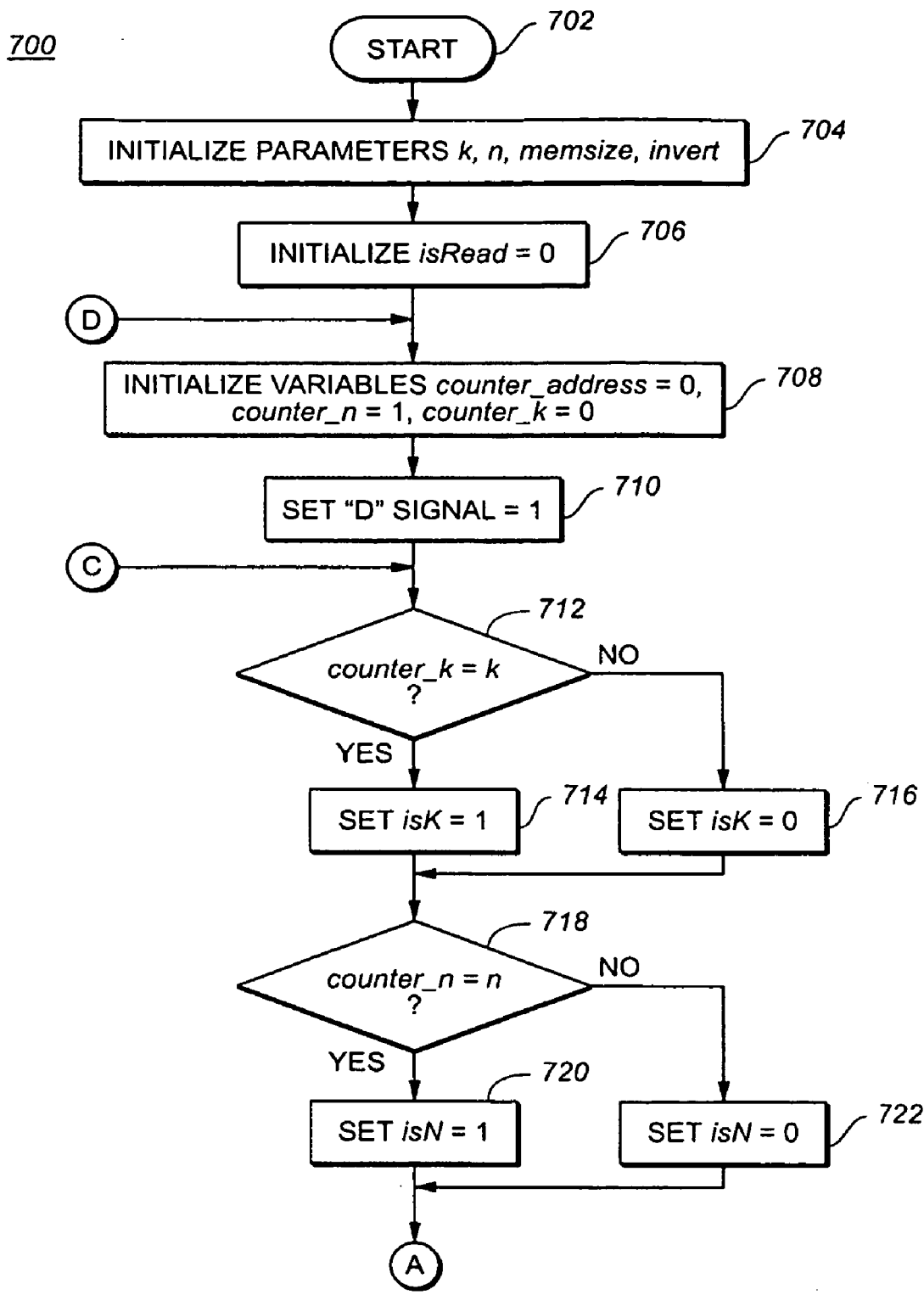
FIG._7A

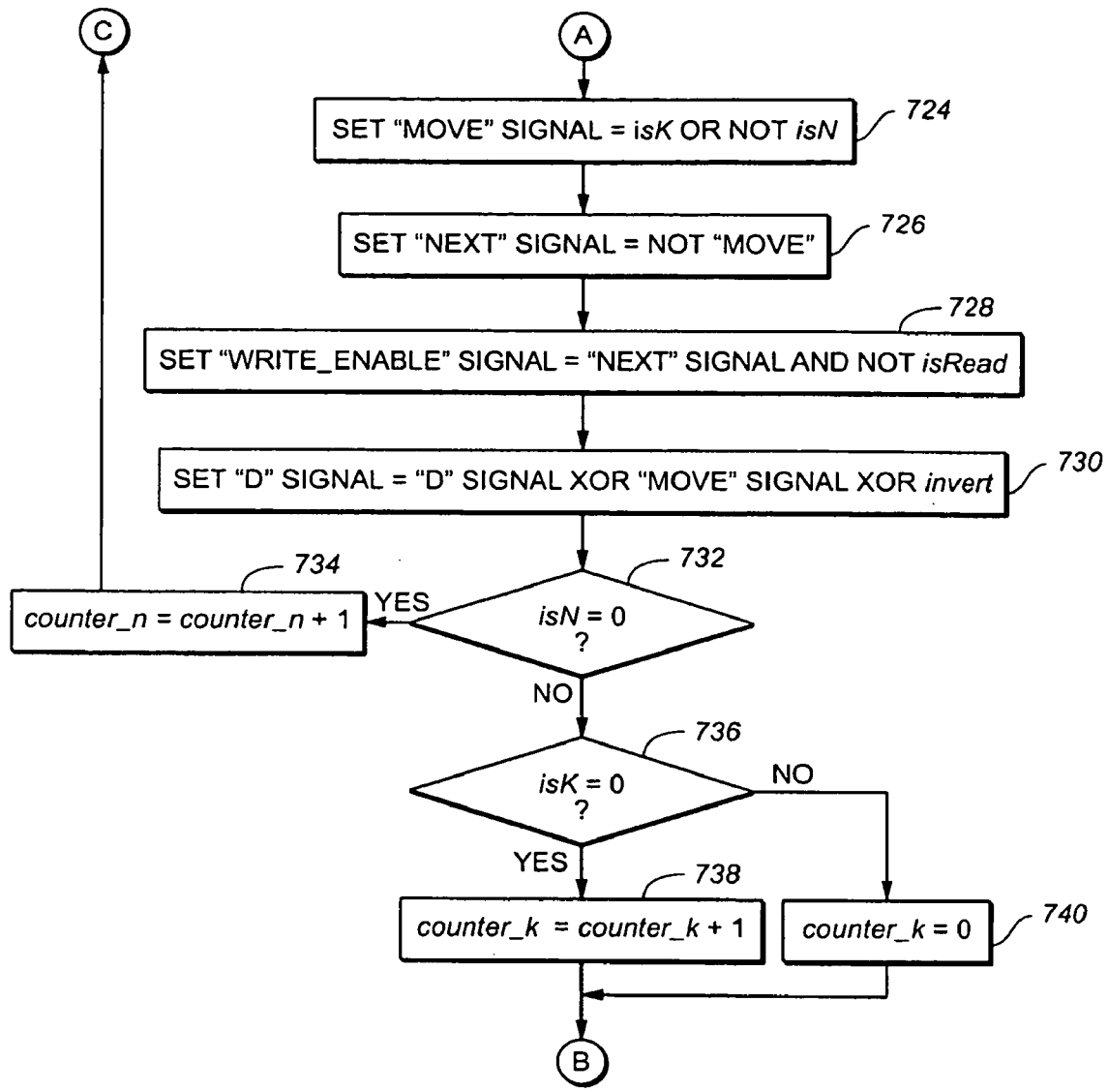
FIG._7B

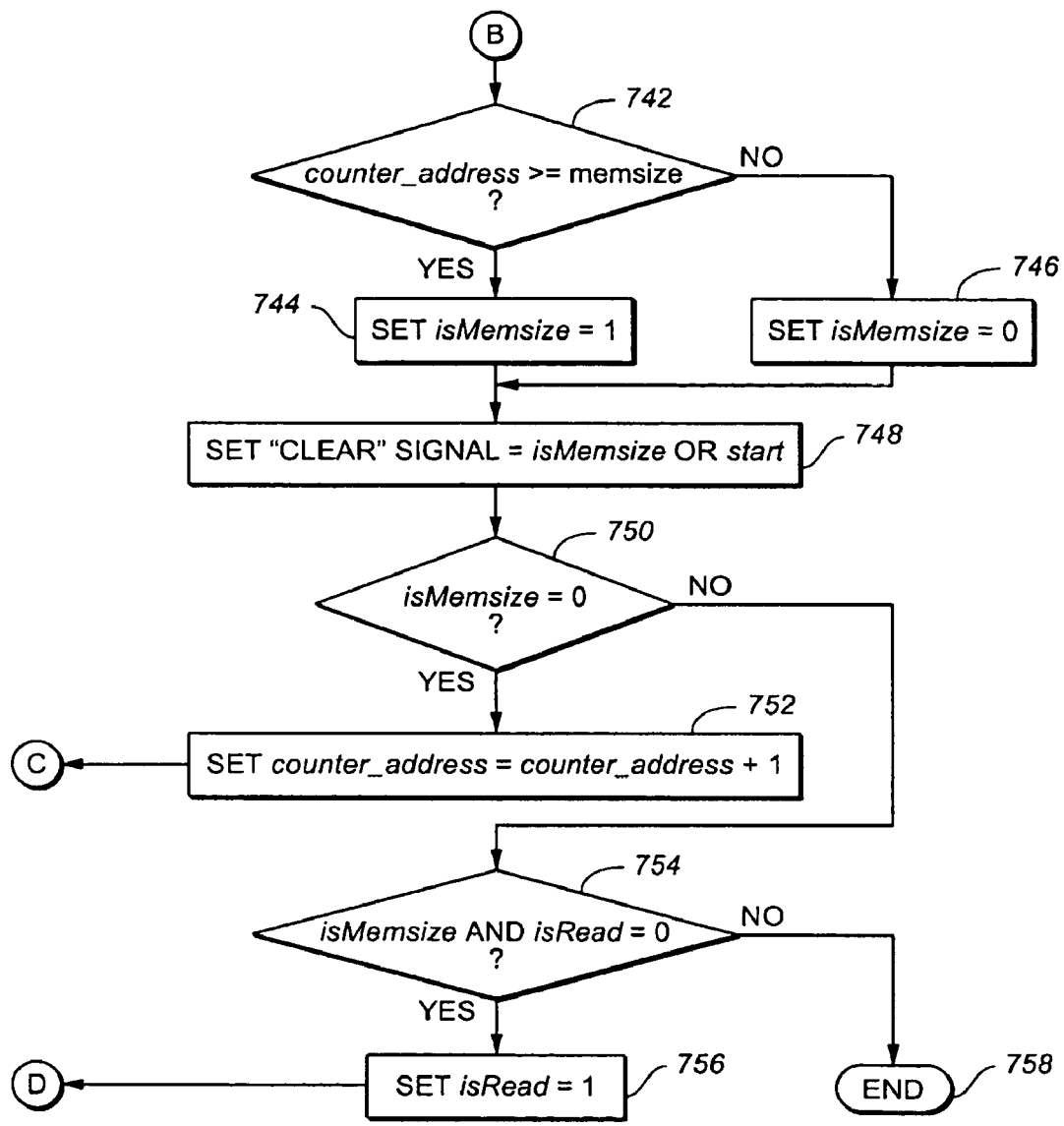
FIG._7C

BUILT-IN TEST FOR MULTIPLE MEMORY CIRCUITS

FIELD OF THE INVENTION

The present invention relates generally to the testing of integrated circuit memories. More specifically, but without limitation thereto, the present invention relates to generating a set of test vectors for multiple memory circuits of different sizes.

BACKGROUND OF THE INVENTION

In circuit designs that include multiple memory devices, such as computers, it is desirable to be able to detect and locate memory errors. Conventional testing devices utilize complex routing interconnections, especially in circuits that include memory devices having differing sizes. The complex routing results in a corresponding increase in cost for testing. Thus, there is a need for a memory testing device that overcomes these and other disadvantages.

SUMMARY OF THE INVENTION

In one aspect of the present invention, a memory test circuit includes a collar for coupling to a memory device for switching an address bus and a data bus of the memory device between an external circuit and the collar in response to a switching signal; and a controller coupled to the collar for generating the switching signal, a test vector, and control signals between the controller and the collar on as few as seven control lines for testing the memory device with the test vector. Multiple memory devices of various sizes may be tested with the same controller concurrently.

In another aspect of the present invention, a method of testing a memory device includes switching an address bus and control lines of the memory device between an external circuit and a collar in response to a switching signal; and generating the switching signal, a test vector, and control signals from a controller coupled to the collar by no more than eight control lines to test the memory device with the test vector.

DESCRIPTION OF THE SEVERAL VIEWS OF THE DRAWINGS

The present invention is illustrated by way of example and not limitation in the accompanying figures, in which like references indicate similar elements throughout the several views of the drawings, and in which:

FIG. 1 illustrates a schematic diagram of a memory test circuit according to an embodiment of the present invention;

FIG. 2 illustrates a schematic diagram of a collar for the memory test circuit of FIG. 1;

FIG. 3 illustrates a schematic diagram of a data register for the collar of FIG. 2;

FIG. 4 illustrates a schematic diagram of an address register for the collar of FIG. 2;

FIGS. 5A and 5B illustrate a flow chart of the first part of a test algorithm for the memory test circuit of FIG. 1;

FIG. 6 illustrates the sequence of control signals generated by the first part of the test algorithm of FIG. 5;

FIGS. 7A, 7B, and 7C illustrate a flow chart of the second part of a test algorithm for the memory test circuit of FIG. 1; and FIG. 8 illustrates the sequence of control signals generated by the second part of the test algorithm of FIG. 7.

Elements in the figures are illustrated for simplicity and clarity and have not necessarily been drawn to scale. For example, the dimensions of some of the elements in the figures may be exaggerated relative to other elements to help to improve understanding of embodiments of the present invention.

DESCRIPTION OF THE ILLUSTRATED EMBODIMENTS

One method for detecting and locating memory errors is to incorporate a memory built-in test device (memBIST) in the circuit design. The memory test device writes a sequential bit pattern into every data location of each memory device. The bit pattern is generated by an algorithm that uses a bridging defect based fault model that does not depend on the physical placement of cells. The bit pattern is then read from each of the memory devices and compared with the same bit pattern that was previously written to determine whether any bit errors have occurred. If a bit error does occur, the memory device that generated the error is reported to a central controller to facilitate replacement of the defective memory device.

The memory devices are tested by switching the address bus and the control lines of the memory devices from external circuitry normally used in performing the functions of the circuit design incorporating the memory devices to a test collar. The test collar contains circuitry for writing a test vector into each memory location and for comparing the test vector with the data read from the corresponding memory location to detect errors. When the testing is complete, the address bus and the control lines of the memory devices are switched back to the external circuitry. The built-in memory test circuit allows the memory devices to be tested in place without removing them from the circuit. The tests may therefore be performed conveniently on a periodic basis, for example, during idle time when the memory devices are not being used.

In one aspect of the present invention, a memory test circuit includes a collar for coupling to a memory device for switching an address bus and a data bus of the memory device between an external circuit and the collar in response to a switching signal; and a controller coupled to the collar for generating the switching signal, a test vector, and control signals between the controller and the collar on no more than eight control lines for testing the memory device with the test vector.

FIG. 1 illustrates a schematic diagram of a memory test circuit 100 according to an embodiment of the present invention. Shown in FIG. 1 are a controller 102, collars 104, memory devices 106, AND gates 108, latches 110, a "TEST_ENABLE" line 120, a "START" line 121, a "D" line 122, a "CLEAR" line 124, a "NEXT" line 126, a "WRITE_ENABLE" line 128, a "MOVE" line 130, an "MBIST_GO" line 132, a "TEST_IN" line 134, and a "TEST_CLOCK" line 246. To simplify the description, the signals carried by each of the control lines are referenced by the name of the control line. For example, the signal on the "TEST_ENABLE" line 120 is referred to as the "TEST_ENABLE" signal 120.

In the present invention, a single controller 102 is used to test multiple memory devices. Each memory device 106 may be one of many well known, commercially available memory devices having the same or a different size without requiring a change in the controller design. Also, only seven output control lines and a single input control line are needed to connect the controller 102 to the memory devices 106 regardless of the size of the memory devices used, which simplifies routing the interconnections.

The controller 102 receives the "TEST_ENABLE" signal 120 and the "START" signal 121 generated by an external source (not shown). The external source may be any suitable logic circuit for initiating a test cycle. The controller 102 repeats the "TEST_ENABLE" signal 120 to generate the switching signal that causes the collars 104 to switch the address bus, the input data bus, and the control lines of the memory devices 106 between an external circuit (not shown) connected to the memory devices 106 and the collars 104. The switching signal may be generated, for example, on a periodic basis according to an internal clock during times when the memory devices 106 are not being used to function in the external circuit. Other well known means for generating the switching signal using an additional control line to the controller 102 from an external device may also be used to practice the present invention. The controller also generates test vectors for testing the memory devices 106. The test vectors are transferred to the collars 104 bit-serially on the "D" line 122 to minimize the number of control lines from the controller 102. The "START" signal 121 is generated by the "TEST_ENABLE" signal 120 according to well known techniques.

The collars 104 switch the address bus, the input data bus, and memory control lines of the memory devices 106 between an external circuit (not shown) and the collars 104 in response to the switching signal on the "TEST_ENABLE" line 120. The external circuit may be any circuit made according to well known techniques that includes the memory devices 106. The test collars 104 also format the test vectors into data words for writing into the memory devices 106 and compare the test vector written into the memory devices 106 with the data read out of the memory devices 106 to detect errors.

FIG. 2 illustrates a schematic diagram of a collar 104 for the memory test circuit of FIG. 1. Shown in FIG. 2 are a "TEST_ENABLE" line 120, a "D" line 122, a "CLEAR" line 124, a "NEXT" line 126, a "WRITE_ENABLE" line 128 (also referred to as "WE"), a "MOVE" line 130, an address register 202, a data register 204, multiplexers 206, 208, 210, 212, and 214, an address comparator 216, a data comparator 218, a "TEST_OUT" line 219, an output data bus 220, an external input data bus 222, an internal input data bus 224, a memory input data bus 226, an external enable line 228, an internal enable line 230, a memory enable line 232, an external address bus 234, an internal address bus 236, a memory address bus 238, an external write enable line 240, a memory write enable line 242, an external clock line 244, a test clock line 246, and a memory clock line 248.

The address register 202 is cleared by the "CLEAR" signal 124 and increments to the next address in response to each "NEXT" signal 126. The data register 204 shifts the "D" signal 122 into a data word in response to each "MOVE" signal 130.

The multiplexers 206, 208, 210, 212, and 214 connect each of the memory devices 106 either to the external circuit or to one of the test collars 104 in response to the "TEST_ENABLE" signal. The multiplexer 206 switches the memory input data bus 226 between the external input data bus 222 and the internal input data bus 224 in response to the "TEST_ENABLE" signal 120. The multiplexer 208 switches the memory enable line 232 between the external enable line 228 and the internal enable line 230. The multiplexer 210 switches the memory address bus 238 between the external address bus 234 and the internal address bus 236. The multiplexer 212 switches the memory write enable line 242 between the external write enable line 240 and the "WRITE_ENABLE" line 128. The multiplexer 214 switches the memory clock line 248 between the external clock line 244 and the test clock line 246. The test clock is generated on the "TEST_CLOCK" line 246 according to well known techniques by circuitry included in the memory test circuit 100.

The address comparator 216 generates the internal enable signal 230 in response to the internal address 236. If the internal address 236 is outside the address range of the memory device 106, then the internal enable signal 230 is false, otherwise the internal enable signal 230 is true. By only enabling the memory device 106 for addresses within its address range, memories having different sizes may be tested in the same test cycle.

The data comparator 218 compares the output data 220 with the internal input data 224. If they are not identical, the data comparator 218 generates the "TEST_OUT" signal 219 with a false value. The internal enable signal 230 is also input to the data comparator 218 to avoid generating data errors when the memory device 106 is not enabled by the address comparator 216. The "TEST_OUT" signal 219 from each of the collars 104 is ANDed by the AND gates 108 with the "MBIST_GO" signal 132 to generate the "TEST_IN" signal 134. If any of the "TEST_OUT" signals 219 is zero, then the "TEST_IN" signal 134 is also set to zero, and the "MBIST_GO" signal 132 is latched to zero. The latches 110 latch the control signals "TEST_ENABLE" 120, "D" 122, "CLEAR" 124, "NEXT" 126, "WRITE_ENABLE" 128, "MOVE" 130, and "MBIST_GO" 132 in response to the "TEST_ENABLE" signal 120 and the test clock signal 246 to locate a defective memory.

FIG. 3 illustrates a schematic diagram of a data register 204 for the collar of FIG. 2. Shown in FIG. 3 are flip-flops 302, 304, and 306, a "D" line 122, a "MOVE" line 130, and an internal input data bus 224. In response to each "MOVE" signal 130, the data register 204 latches the "D" signal 122 at the "Q" output of the flip-flop 302 while the previous "Q" output of the flip-flop 302 is latched at the "Q" output of the flip-flop 304, and so on down to last flip-flop 306. In this manner the test vector is converted from the serial format generated by the controller 102 into the parallel arrangement of the internal input data bus 224.

FIG. 4 illustrates a schematic diagram of an address register 206 for the collar of FIG. 2. Shown in FIG. 4 are a "CLEAR" line 124, a "NEXT" line 126, an internal address bus 236, a clear register 402, and an incrementor 404.

The clear register 402 resets the internal address 236 to zero in response to the "CLEAR" signal 124 and latches the output of the incrementor 404 in response to each "NEXT" signal 126. The incrementor 404 inputs the internal address 236, increments the address by one, and outputs the incremented address to the clear register 402. In this way the address register 206 generates every address within the range of the corresponding memory device 106.

In another aspect of the present invention, a method of testing a memory device includes switching an address bus and control lines of the memory device between an external circuit and a collar in response to a switching signal; and generating the switching signal, a test vector, and control signals from a controller coupled to the collar by no more than eight control lines to test the memory device with the test vector.

The controller 102 drives the control lines according to a test algorithm having two parts for generating a sequence of test vectors having all combinations of bit pairs. The test algorithm is independent from the physical parameters of the memory devices 106 and may be used to test any type of memory.

In the first part of the test algorithm, a sequence of test vectors is generated having the form of m zeroes followed by m ones followed by m zeroes, and so on, where m is a power of two in the sequence $(1, 2, 4, 8, \ldots 2^r)$. r is a positive integer such that $2^r <= n < 2^{r+1}$ where n is the maximum word size of the memory device 106. For example, for a memory device 106 having a word size of four, the sequence of test vectors generated by the test algorithm is 0101, 0011, 0000. The sequence of test vectors continues with the inverse of the previous test vectors, in this example, 1010, 1100, 1111. The first test vector is written into every memory address, and the memory device is read and compared with the test vector to detect errors. The next test vector is written into every memory address, and so on until each of the memory devices 106 have been checked with all the test vectors.

In the second part of the test algorithm, a test vector is generated having the form of 010101 . . . of length n. For each value of k, where k equals $1, 2, 4, 8, \ldots, 2^q$ and where $2^q$ is less than or equal to the size of the memory device 106 and the size of the memory device 106 is less than $2^{q+1}$, i.e., $k=1, 2, 4, 8, \ldots, 2^q$ and $2^q <= memsize < 2^{q+1}$. The test vector is written into the first k addresses of the memory device 106, the inverse of the test vector is written into the next k addresses, the non-inverted test vector is written into the next k addresses, and so on. The memory device is read and compared with the test vectors to detect possible errors. The next step, in which the value of invert equals one, is identical to that described above, except that the test vector has the initial value of 101010 . . . .

FIGS. 5A and 5B illustrate a flow chart 500 of the first part of the test algorithm for the memory test circuit of FIG. 1. Logic operations are indicated in capital letters, for example, "A OR B" means "A logically OR'ed with B". The logic operations used are OR, XOR (exclusive OR), AND, and NOT. Also, the values of one and zero associated with the logic operations are used herein including the claims only to indicate one of two logical states (true or false) and have no numerical significance.

Step 502 is the entry point for the flow chart 500.

In step 504, the parameters m, n, memsize, and invert are initialized. n is the maximum word size of the memory devices 106; m is a power of two in the sequence $(1, 2, 4, 8, \ldots 2^r)$ that indicates the number of times a bit is repeated in the test vector and r is a positive integer such that $2^r <= n <= 2^{r+1}$; memsize is the maximum address range of the memory device 106; and invert is set to zero for generating test vectors having a bit pattern starting with zero or to one for generating test vectors having a bit pattern starting with one.

In step 506, the following variables are initialized: isRead is set to zero, counter_address is set to zero, counter_n is set to zero, and counter_m is set to one.

In step 508, the "D" signal 122 is initialized to zero.

In step 510, if counter_m>=m, then control transfers to step 512, else control transfers to step 514.

In step 512, isM is set to one, and control transfers to step 516.

In step 514, isM is set to zero.

In step 516, the "D" signal 122 is set to the previous value of the "D" signal 122 XOR isM XOR invert. For example, if the "D" signal 122 equals zero, isM equals 1, and invert equals 0, then the new value of the "D" signal 122 is set to (0 XOR 1 XOR 0)=1.

In step 518, if counter_n<n, then control transfers to step 520, else control transfers to step 522.

In step 520, the "MOVE" signal 130 is set to one, and control transfers to step 524.

In step 522, the "MOVE" signal 130 is set to zero. In step 524, the "NEXT" signal 126 is set to the inverse of the "MOVE" signal 130.

In step 526, the "WRITE_ENABLE" signal 128 is set to the inverse of the "MOVE" signal 130 AND the inverse of isRead. For example, if the "MOVE" signal 130 equals one and isRead equals 0, then the "WRITE_ENABLE" signal 128 is set to ((NOT 1) AND (NOT 0))=0.

In step 528, if the "MOVE" signal 130 equals one, then control transfers to 530, else control transfers to step 538.

In step 530, counter_n is incremented by one.

In step 532, if isM equals 1, then control transfers to step 534, else control transfers to step 536.

In step 534, counter_m is set equal to one, and control transfers to step 510.

In step 536, counter_m is incremented by one, and control transfers to step 510.

In step 538, if counter_address >=memsize, then control transfers to step 540, else control transfers to step 542.

In step 540, the variable isMemsize is set to one, and control transfers to step 544.

In step 542, the variable isMemsize is set to zero.

In step 544, the "CLEAR" signal 124 is set to isMemsize OR the "START" signal 121. For example, if isMemsize equals zero and the "START" signal 121 equals one, then the "CLEAR" signal 124 is set to (0 OR 1)=1.

In step 546, if isMemsize equals zero, then control transfers to step 548, else control transfers to step 550.

In step 548, counter_address is incremented by one, and control transfers to step 510.

In step 550, if isMemsize AND isread equals zero, then control transfers to step 552, else control transfers to step 554.

In step 552, isRead is set to one, counter_address is set to zero, and control transfers to step 510.

Step 554 is the exit point for the flow chart 500.

The flow chart 500 may be implemented by logic functions in a microprocessor or a field programmable gate array or other devices for performing logical functions according to well known techniques to make the controller 102.

FIG. 6 illustrates a sequence of control signals generated by the first part of the test algorithm of FIG. 5. Shown in FIG. 6 are three phases 602, 604, and 606. The notation TEST1 (m, n, memsize, 0) means the first part of the test algorithm using the parameters m for the number of times a bit is repeated in a test vector, n for the data word size of the memory device 106, memsize for the number of data locations of the memory device 106, and an initial bit pattern value of zero.

In phase 602, the address register 206 is cleared and the test vector is serially clocked into the n outputs of the data register 204.

In phase 604, the address register 206 is incremented to write the test vector into every data word of the memory device 106. The alpha symbol indicates the value of the last binary digit in the test vector that is inverted every m digits in the next test vector.

In phase 606, the address register is cleared and incremented to read every data word in the memory device 106. Each data word is compared to the test vector to detect memory device errors.

FIGS. 7A, 7B, and 7C illustrate a flow chart 700 of the second part of the test algorithm for the memory test circuit of FIG. 1. Logic operations performed on logic variables are indicated in capital letters, for example, "A OR B" means "A logically OR'ed with B". The logic operations used are OR, XOR (exclusive OR), AND, and NOT. Also, as mentioned above, the values of one and zero associated with the logic operations are used herein including the claims only to indicate one of two logical states (true or false) and have no numerical significance.

Step 702 is the entry point for the flow chart 700.

In step 704, the parameters k, n, memsize, and invert are initialized. n is the maximum word size of the memory devices 106; memsize is the maximum address range of the memory device 106; k=1, 2, 4, 8, . . . , $2^q$ where $2^q <=$ memsize$<2^{q+1}$; and invert is set to zero for generating test vectors having a bit pattern starting with zero or to one for generating test vectors having a bit pattern starting with one.

In step 706, the variable isRead is set to zero.

In step 708, the following variables are initialized: counter_address is set to zero, counter_n is set to one, and counter_k is set to zero.

In step 710, the "D" signal 122 is initialized to one.

In step 712, if counter_k equals k, then control transfers to step 714, else control transfers to step 716.

In step 714, the variable isK is set to one, and control transfers to step 718.

In step 716, the variable isK is set to zero.

In step 718, if counter_n equals n, control transfers to step 720, else control transfers to step 722.

In step 720, the variable isN is set to one, and control transfers to step 724.

In step 722, the variable isN is set to zero.

In step 724, the "MOVE" signal 130 is set to isK OR NOT isN.

In step 726, the "NEXT" signal 130 is set to the inverse of the "MOVE" signal.

In step 728, the "WRITE_ENABLE" signal 128 is set to the "NEXT" signal 126 AND NOT isRead. For example, if the "NEXT" signal 126 equals one and isRead equals zero, then the "WRITE_ENABLE" signal 128 is set to (1 AND NOT 0)= 1.

In step 730, the "D" signal 122 is set to the previous value of the "D" signal 122 XOR the "MOVE" signal 130 XOR invert. For example, if the "D" signal 122 equals one, the "MOVE" signal 130 equals zero, and invert equals 1, then the new value of the "D" signal 122 is set to (1 XOR 0 XOR 1)=0.

In step 732, if isN equals zero, then control transfers to 734, else control transfers to step 736.

In step 734, counter_n is incremented by one, and control transfers to step 710.

In step 736, if isK equals zero, then control transfers to step 738, else control transfers to step 740.

In step 738, counter_k is incremented by one, and control transfers to step 742.

In step 740, counter_k is set to zero.

In step 742, if counter_address >=memsize, then control transfers to step 744, else control transfers to step 746.

In step 744, the variable isMemsize is set to one, and control transfers to step 748.

In step 746, the variable isMemsize is set to zero.

In step 748, the "CLEAR" signal 124 is set to isMemsize OR the "START" signal 121. For example, if isMemsize equals zero and the "START" signal 121 equals one, then the "CLEAR" signal 124 is set to (0 OR 1)=1.

In step 750, if isMemsize equals zero, then control transfers to step 752, else control transfers to step 754.

In step 752, counter_address is incremented by one, and control transfers to step 710.

In step 754, if isMemsize AND isread equals zero, then control transfers to step 756, otherwise, control transfers to step 758.

In step 756, isRead is set to one, and control transfers to step 708.

Step 758 is the exit point for the flow chart 700.

The flow chart 700 may be implemented by logic functions in a microprocessor or a field programmable gate array or other devices for performing logical functions according to well known techniques to make the controller 102.

FIG. 8 illustrates a sequence of control signals generated by the second part of the test algorithm of FIG. 7. Shown in FIG. 8 are four phases 802, 804, 806, and 808. The notation TEST2 (k, n, memsize, 0) represents the second part of the test algorithm using the parameters k, where k= 1, 2, 4, 8, . . . , $2^q$ where $2^q <=$memsize$<2^{q+1}$; n is the data word size of the memory device 106, memsize is the number of data locations of the memory device 106, and zero is the initial bit pattern value.

In phase 802, the address register 206 is cleared and the test vector is serially clocked into the n outputs of the data register 204.

In phase 804, the address register 206 is incremented to write the test vector 010101 . . . into the next k locations of the memory device 106 followed by the inverse of the test vector in the next k locations, the non-inverted test vector into the next k locations, and so on. The alpha symbol indicates the value of the last binary digit in the test vector that is inverted every k addresses in the next test vector.

In phase 804, the address register 206 is cleared and the test vector is serially clocked into the n outputs of the data register 204.

In phase 806, the address register 206 is incremented to read every data word in the memory device 106. Each data word is compared to the test vector to detect errors.

The built-in memory test circuit described above can test all combinations of bit pairs for multiple memories of various sizes using no more than eight control lines between the controller and the collar to test the memory devices with the test vector.

While the invention herein disclosed has been described by means of specific embodiments and applications thereof, other modifications, variations, and arrangements of the present invention may be made in accordance with the above teachings other than as specifically described to practice the invention within the spirit and scope defined by the following claims.

What is claimed is:

1. A memory test circuit comprising:
   a collar for coupling to a memory device for switching an address bus and a data bus of the memory device between an external circuit and the collar in response to a switching signal; and
   a single controller coupled to the collar for generating the switching signal, a test vector, and control signals on only seven control lines between the controller and the collar for testing the memory device with the test vector.

2. The memory test circuit of claim 1 wherein the controller generates the control signals for multiple memory devices of various sizes.

3. The memory test circuit of claim 1 wherein each of the seven control lines carries only one of a "CLEAR" signal, a "NEXT" signal, a "TEST_ENABLE" signal, a "WRITE_ENABLE" signal, a "MOVE" signal, a "D" signal, and a "TEST_IN" signal.

4. The memory test circuit of claim 3 wherein the "MBIST_GO" signal has an initial value of one and is latched to zero upon detection of a memory device error.

5. The memory test circuit of claim 3 wherein the collar comprises a multiplexer coupled to the address bus of the memory device and the "TEST_ENABLE" signal.

6. The memory test circuit of claim 5 wherein the collar comprises a data register coupled to the multiplexer for writing a test vector into the memory device.

7. The memory test circuit of claim 6 wherein the test vector is transferred to the data register by the "MOVE" signal and the "D" signal.

8. The memory test circuit of claim 6 wherein the collar comprises a data comparator coupled to the data register and to the memory device for generating the "TEST_IN" signal.

9. The memory test circuit of claim 5 wherein the collar comprises an address register coupled to the multiplexer.

10. The memory test circuit of claim 9 wherein the collar comprises an address comparator coupled to the address register for generating a memory enable signal that is true for addresses within an address range of the memory device and that is false for addresses outside the address range of the memory device.

11. The memory test circuit of claim 9 wherein the address register is reset to zero by the "CLEAR" signal.

12. The memory test circuit of claim 11 wherein the address register is incremented by the "NEXT" signal.

13. A memory test circuit comprising:
a collar for coupling to a memory device for switching an address bus and a data bus of the memory device between an external circuit and the collar in response to a switching signal; and
a controller coupled to the collar for generating the switching signal, a test vector, and control signals on only seven control lines between the controller and the collar for testing the memory device with the test vector wherein the control signals comprise a "CLEAR" signal, a "NEXT" signal, a "TEST_ENABLE" signal, a "WRITE_ENABLE" signal, a "MOVE" signal, a "D" signal, and a "TEST_IN" signal and wherein the controller comprises logic for testing the memory device by performing the following functions:
(a) initializing parameters m, n, memsize, and invert wherein n is the maximum word size of the memory device, m is a power of two in the sequence (1, 2, 4, 8, ... $2^r$) indicating a number of times a bit is repeated in the test vector and r is a positive integer such that $2^r<=n<=2^{r+1}$, memsize is a maximum address range of the memory device, invert is set to zero for generating the test vector having a bit pattern starting with zero and to one for generating test vector having a bit pattern starting with one;
(b) initializing a plurality of variables as follows: isRead to zero, counter_address to zero, counter_n to zero, and counter_m to one;
(c) initializing the "D" signal to zero;
(d) if counter_m>=m, transferring control to (e), otherwise transferring control to (f);
(e) setting isM to one and transferring control to (g);
(f) setting isM to zero;
(g) setting the "D" signal 122 to a previous value of the "D" signal 122 XOR isM XOR invert;
(h) if counter_n<n, transferring control to (i), otherwise transferring control to (j);
(i) setting the "MOVE" signal to one and transferring control to (k);
(j) setting the "MOVE" signal to zero
(k) setting the "NEXT" signal to the inverse of the "MOVE" signal;
(l) setting the "WRITE_ENABLE" signal to the inverse of the "MOVE" signal AND the inverse of isRead;
(m) if the "MOVE" signal equals one, then transferring control to (n), otherwise transferring control to (o);
(n) incrementing counter_n by one and transferring control to (r);
(o) if isM is equal to 1, then transferring control to (p), otherwise transferring control to (q);
(p) setting counter_m to one and transferring control to step 510;
(q) counter_m is incremented by one, and control transfers to (d);
(r) if counter_address >=memsize, then transferring control to (s), otherwise transferring control to (t);
(s) setting isMemsize to one and transferring control to (u);
(t) setting isMemsize to zero;
(u) setting the "CLEAR" signal to isMemsize OR the "START" signal;
(v) if isMemsize equals zero, then transferring control to (w), otherwise transferring control to (x);
(w) incrementing counter_address by one and transferring control to (d);
(x) if isMemsize AND isread equals zero, then transferring control to (y), otherwise transferring control to (z);
(y) setting isRead to one, setting counter_address to zero, and transferring control to (d); and
(z) setting the "TEST_OUT" signal to zero if an error is detected, otherwise setting the "TEST_OUT" signal to one.

14. A memory test circuit comprising:
a collar for coupling to a memory device for switching an address bus and a data bus of the memory device between an external circuit and the collar in response to a switching signal; and
a controller coupled to the collar for generating the switching signal, a test vector, and control signals on only seven control lines between the controller and the collar for testing the memory device with the test vector wherein the control signals comprise a "CLEAR" signal, a "NEXT" signal, a "TEST_ENABLE" signal, a "WRITE_ENABLE" signal, a "MOVE" signal, a "D" signal, and a "TEST_IN" signal, further comprising logic in the controller for testing the memory device by performing the following functions:
(a) initializing parameters k, n, memsize, and invert wherein n is the maximum word size of the memory device, memsize is a maximum address range of the memory device, k= 1, 2, 4, 8, ... , $2^{q+1}$ wherein q is a positive integer such that $2^q<=$ memsize$<2^{q+1}$, and invert is set to zero for generating the test vector having a bit pattern starting with zero and to one for generating test vector having a bit pattern starting with one;
(b) setting a variable isRead to zero;
(c) initializing a plurality of variables as follows: counter_address to zero, counter_n to one, and counter_k to zero;
(d) initializing the "D" signal to one;
(e) if counter_k equals k, then transferring control to (f), otherwise transferring control to (g);
(f) setting a variable isK to one and transferring control to (h);

(g) setting isK to zero;
(h) if counter_n equals n, then transferring control to (i), otherwise transferring control to (j);
(i) setting a variable isN to one and transferring control to (k);
(j) setting isN to zero;
(k) setting the "MOVE" signal to isK OR NOT isN;
(l) setting the "NEXT" signal to an inverse of the "MOVE" signal;
(m) setting the "WRITE_ENABLE" signal to the "NEXT" signal AND NOT isRead;
(n) setting the "D" signal to a previous value of the "D" signal XOR the "MOVE" signal XOR invert;
(o) if isN equals zero, then transferring control to (p), otherwise transferring control to (q);
(p) incrementing counter_n by one and transferring control to (r);
(q) if isK equals zero, then transferring control to (r), otherwise transferring control to (s);
(r) incrementing counter_k by one and transferring control to (t);
(s) setting counter_k to zero;
(t) if counter_address >=memsize, then transferring control to (u), otherwise transferring control to (v);
(u) setting a variable isMemsize to one and transferring control to (w);
(v) setting isMemsize to zero;
(w) setting the "CLEAR" signal to isMemsize OR the "START" signal;
(x) if isMemsize equals zero, then transferring control to (y), otherwise transferring control to (z);
(y) incrementing counter_address by one and transferring control to (e);
(z) if isMemsize AND isread equals zero, then transferring control to (aa), otherwise transferring control to (bb);
(aa) settng isRead to one and transferring control to (c); and
(bb) setting the "TEST_OUT" signal to zero if an error is detected, otherwise setting the "TEST_OUT" signal to one.

15. A method for testing a memory device comprising:
switching an address bus and a data bus of the memory device between an external circuit and a collar in response to a switching signal; and
generating the switching signal, a test vector, and control signals on only seven control lines between a single controller and the collar to test the memory device with the test vector.

16. The method of claim 15 further comprising testing multiple memory devices of various sizes.

17. The method of claim 15 wherein each of the seven control lines carries only one of a "CLEAR" signal, a "NEXT" signal, a "TEST_ENABLE" signal, a "WRITE_ENABLE" signal, a "MOVE" signal, a "D" signal, and a "TEST_IN" signal.

18. The method of claim 17 wherein the switching signal is the "TEST_ENABLE" signal.

19. The method of claim 15 further comprising generating a memory enable signal that is true for addresses within an address range of the memory device and that is false for addresses outside the address range of the memory device.

20. A method for testing a memory device comprising:
switching an address bus and a data bus of the memory device between an external circuit and a collar in response to a switching signal; and
generating the switching signal, a test vector, and control signals on only seven control lines between a controller and the collar to test the memory device with the test vector by generating a "CLEAR" signal, a "NEXT" signal, a "TEST_ENABLE" signal, a "WRITE_ENABLE" signal, a "MOVE" signal, a "D" signal, and a "TEST_IN" signal and performing the following functions:
(a) initializing parameters m, n, memsize, and invert wherein n is the maximum word size of the memory device, m is a power of two in the sequence (1, 2, 4, 8, ... $2^r$) indicating a number of times a bit is repeated in the test vector and r is a positive integer such that $2^r <= n <= 2^{r+1}$, memsize is a maximum address range of the memory device, invert is set to zero for generating the test vector having a bit pattern starting with zero and to one for generating test vector having a bit pattern starting with one;
(b) initializing a plurality of variables as follows: isRead to zero, counter_address to zero, counter_n to zero, and counter_m to one;
(c) initializing the "D" signal to zero;
(d) if counter_m>=m, transferring control to (e), otherwise transferring control to (f);
(e) setting isM to one and transferring control to (g);
(f) setting isM to zero;
(g) setting the "D" signal 122 to a previous value of the "D" signal 122 XOR isM XOR invert;
(h) if counter_n<n, transferring control to (i), otherwise transferring control to (j);
(i) setting the "MOVE" signal to one and transferring control to (k);
(j) setting the "MOVE" signal to zero
(k) setting the "NEXT" signal to the inverse of the "MOVE" signal;
(l) setting the "WRITE_ENABLE" signal to the inverse of the "MOVE" signal AND the inverse of isRead;
(m) if the "MOVE" signal equals one, then transferring control to (n), otherwise transferring control to (o);
(n) incrementing counter_n by one and transferring control to (r);
(o) if isM is equal to 1, then transferring control to (p), otherwise transferring control to (q);
(p) setting counter_m to one and transferring control to step 510;
(q) counter_m is incremented by one, and control transfers to (d);
(r) if counter_address >=memsize, then transferring control to (s), otherwise transferring control to (t);
(s) setting isMemsize to one and transferring control to (u);
(t) setting isMemsize to zero;
(u) setting the "CLEAR" signal to isMemsize OR the "START" signal;
(v) if isMemsize equals zero, then transferring control to (w), otherwise transferring control to (x);
(w) incrementing counter_address by one and transferring control to (d);
(x) if isMemsize AND isread equals zero, then transferring control to (y), otherwise transferring control to (z);
(y) setting isRead to one, setting counter_address to zero, and transferring control to (d); and
(z) setting the "TEST_OUT" signal to zero if an error is detected, otherwise setting the "TEST_OUT" signal to one.

21. A method for testing a memory device comprising:
switching an address bus and a data bus of the memory device between an external circuit and a collar in response to a switching signal; and
generating the switching signal, a test vector, and control signals on only seven control lines between a controller and the collar to test the memory device with the test vector by generating a "CLEAR" signal, a "NEXT" signal, a "TEST_ENABLE" signal, a "WRITE_ENABLE" signal, a "MOVE" signal, a "D" signal, and a "TEST_IN" signal and performing the following functions:
(a) initializing parameters k, n, memsize, and invert wherein n is the maximum word size of the memory device, memsize is a maximum address range of the memory device, k= 1, 2, 4, 8, . . . , $2^q$ wherein q is a positive integer such that $2^q <=$ memsize$< 2^{q+1}$, and invert is set to zero for generating the test vector having a bit pattern starting with zero and to one for generating test vector having a bit pattern starting with one;
(b) setting a variable isRead to zero;
(c) initializing a plurality of variables as follows: counter_address to zero, counter_n to one, and counter_k to zero;
(d) initializing the "D" signal to one;
(e) if counter_k equals k, then transferring control to (f), otherwise transferring control to (g);
(f) setting a variable isK to one and transferring control to (h);
(g) setting isK to zero;
(h) if counter_n equals n, then transferring control to (i), otherwise transferring control to (j);
(i) setting a variable isN to one and transferring control to (k);
(j) setting isN to zero;
(k) setting the "MOVE" signal to isK OR NOT isN;
(l) setting the "NEXT" signal to an inverse of the "MOVE" signal;
(m) setting the "WRITE_ENABLE" signal to the "NEXT" signal AND NOT isRead;
(n) setting the "D" signal to a previous value of the "D" signal XOR the "MOVE" signal XOR invert;
(o) if isN equals zero, then transferring control to (p), otherwise transferring control to (q);
(p) incrementing counter_n by one and transferring control to (r);
(q) if isK equals zero, then transferring control to (r), otherwise transferring control to (s);
(r) incrementing counter_k by one and transferring control to (t);
(s) setting counter_k to zero;
(t) if counter_address >=memsize, then transferring control to (u), otherwise transferring control to (v);
(u) setting a variable isMemsize to one and transferring control to (w);
(v) setting isMemsize to zero;
(w) setting the "CLEAR" signal to isMemsize OR the "START" signal;
(x) if isMemsize equals zero, then transferring control to (y), otherwise transferring control to (z);
(y) incrementing counter_address by one and transferring control to (e);
(z) if isMemsize AND isread equals zero, then transferring control to (aa), otherwise transferring control to (bb);
(aa) settng isRead to one and transferring control to (c); and
(bb) setting the "TEST_OUT" signal to zero if an error is detected, otherwise setting the "TEST_OUT" signal to one.

22. The method of claim 21 further comprising initially setting the "MBIST_GO" signal to one and latching the "MBIST_GO" signal to zero if the "TEST_OUT" signal is set to zero upon detection of a memory device error.

* * * * *